United States Patent
Weber

(10) Patent No.: US 6,833,298 B2
(45) Date of Patent: Dec. 21, 2004

(54) METHOD FOR FABRICATING A SEMICONDUCTOR COMPONENT HAVING AT LEAST ONE TRANSISTOR CELL AND AN EDGE CELL

(75) Inventor: Hans Weber, Ainring (DE)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 10/384,998

(22) Filed: Mar. 10, 2003

(65) Prior Publication Data

US 2003/0232476 A1 Dec. 18, 2003

(30) Foreign Application Priority Data

Mar. 8, 2002 (DE) .......................................... 102 10 272

(51) Int. Cl.[7] .......................................... H01L 21/8234
(52) U.S. Cl. .................... 438/237; 438/268; 257/341
(58) Field of Search ............................... 438/237, 268, 438/524; 257/329, 336, 341

(56) References Cited

U.S. PATENT DOCUMENTS 5,408,117 A * 4/1995 Uenishi ...................... 257/339
5,795,793 A * 8/1998 Kinzer ........................ 438/307
2003/0025152 A1 * 2/2003 Werner et al. ............... 257/328
2003/0151092 A1 * 8/2003 Chien .......................... 257/341

OTHER PUBLICATIONS

Jens Peter Stengl et al.: "Leistungs–MOS–FET–Praxis" [power MOSFET in practice], Pflaum Verlag München, 1992, pp. 33, and 34.

* cited by examiner

Primary Examiner—Richard Elms
Assistant Examiner—Christian D. Wilson
(74) Attorney, Agent, or Firm—Laurence A. Greenberg; Werner H. Stemer; Gregory L. Mayback

(57) ABSTRACT

The present invention relates to a method for fabricating a semiconductor component having at least one transistor cell and an edge cell. The method includes providing a semiconductor body having a channel zone in the region of a transistor cell, a first terminal zone in the region of an edge cell, an insulation layer applied to a front side of the semiconductor body, and an electrode layer applied to the insulation layer. The electrode layer and the insulation layer are patterned in the region of the edge cell and the transistor cell and serve for fabricating complementary doped regions in the channel zone and the first terminal zone. In the region of the edge cell, the patterned electrode layer serves for the subsequent removal of the complementary doped zone during the fabrication of a contact hole.

12 Claims, 4 Drawing Sheets

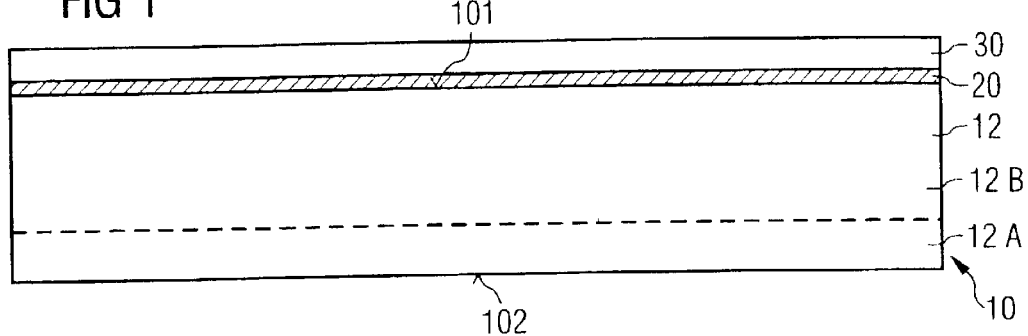
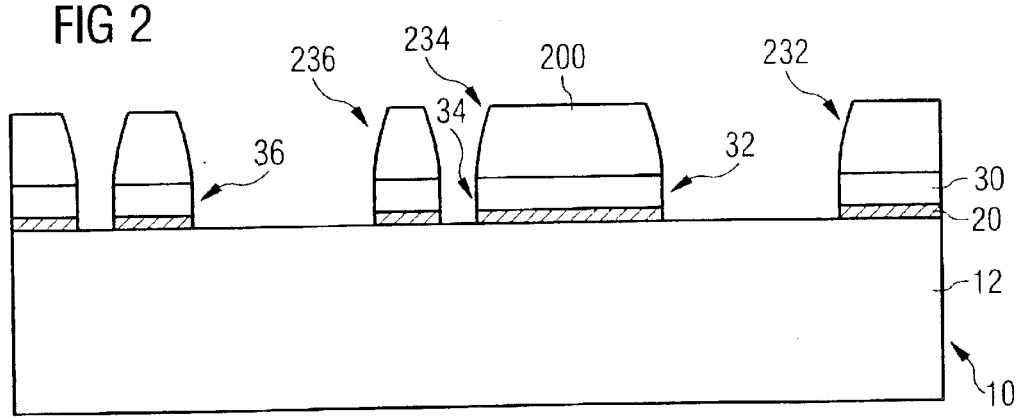
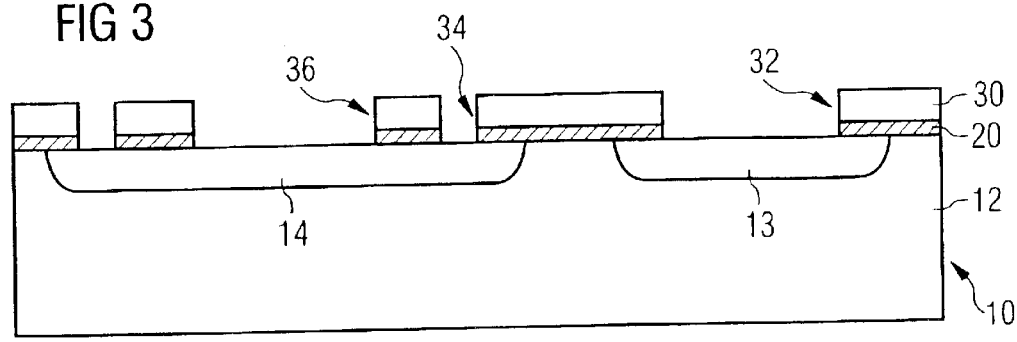

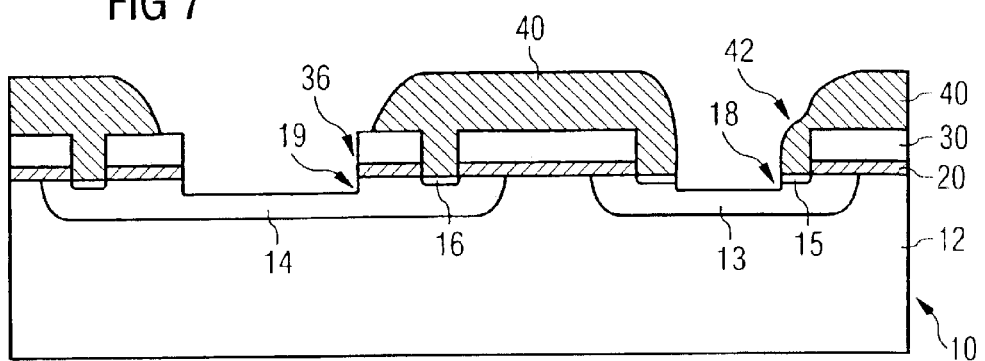
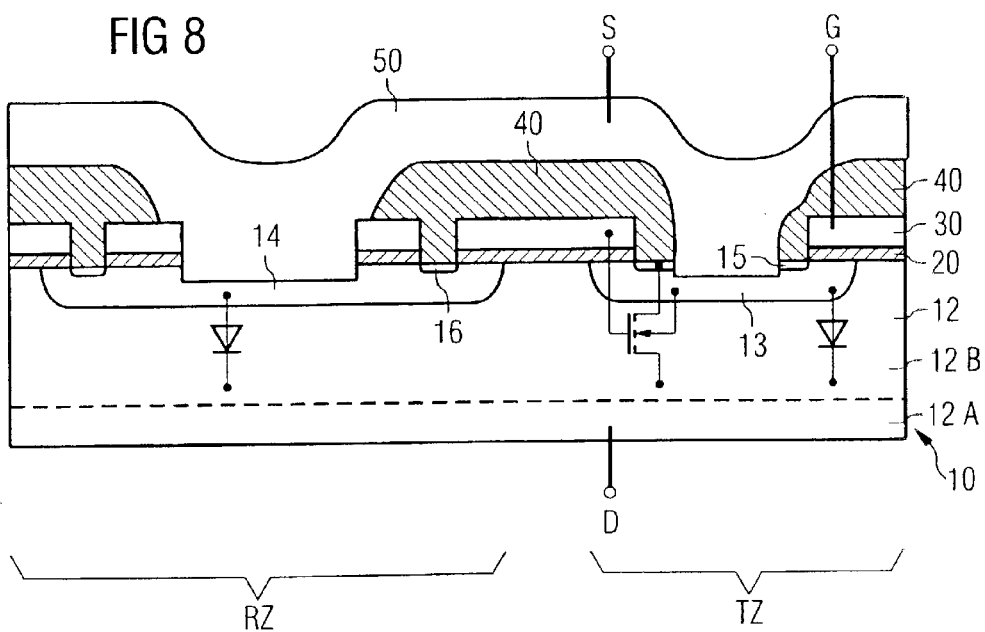

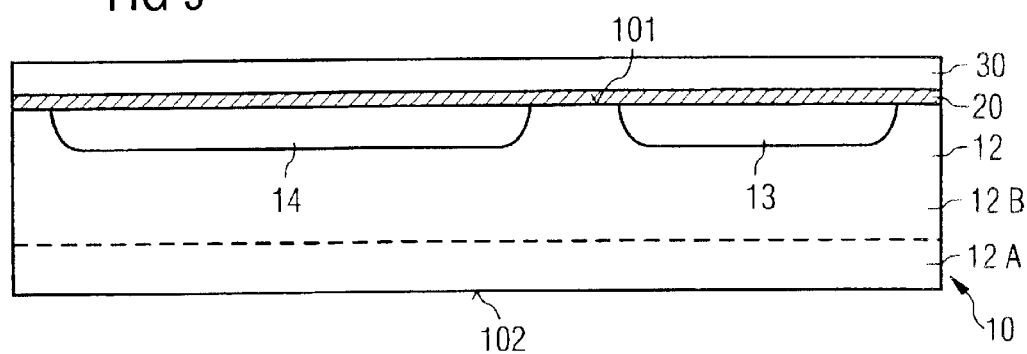
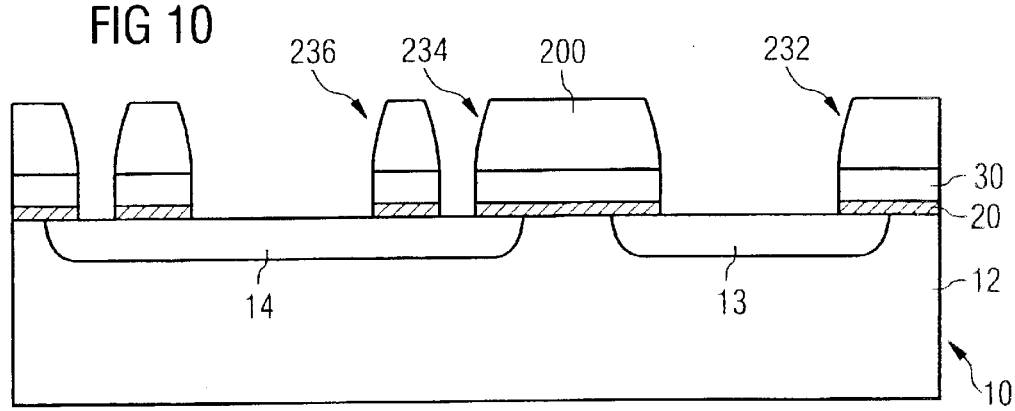

METHOD FOR FABRICATING A SEMICONDUCTOR COMPONENT HAVING AT LEAST ONE TRANSISTOR CELL AND AN EDGE CELL

BACKGROUND OF THE INVENTION

Field of the Invention

The present invention relates to a method for fabricating a semiconductor component having at least one transistor cell and an edge cell arranged adjacent to the transistor cell.

It is sufficiently known for power MOSFETs to be constructed in a cellular fashion. That is to say, to provide a multiplicity of transistor structures arranged next to one another, which in each case form a transistor. These transistors are connected in parallel to outwardly form the power MOSFET, whose current-carrying capacity substantially depends on the number of transistor structures connected in parallel. The cellular construction of a vertical power MOSFET is described, for example, in Stengl/Tihanyi: "Leistungs-MOSFET-Praxis" ["power MOSFETs in practice"], Pflaum Verlag, Munich, 1992, pages 33, 34.

An n-conducting power MOSFET has an n-doped semiconductor body into which, proceeding from a front side, p-doped channel zones are introduced. In turn, n-doped source zones are formed in the p-doped channel zones. The rear side of the semiconductor body usually forms the drain zone of the transistor. The semiconductor body usually has a heavily doped semiconductor substrate and a more weakly doped epitaxial layer in which the channel zones are formed and which forms the drift path of the components. A gate electrode is formed in a manner insulated from the semiconductor body. This gate electrode runs adjacent to the source zone, the channel zone and the drift zone. The doping of the abovementioned zones is complementary to the abovementioned dopings in the case of a p-conducting MOSFET.

The sequence of the source zone, the channel zone doped complementary with respect to the source zone and the drift zone doped complementary with respect to the channel zone results in the formation of a parasitic bipolar transistor which, in the case of an n-conducting MOSFET, is an npn bipolar transistor whose base is formed by the channel zone. If, during the operation of the component, p-type charge carriers (holes) reach, for example, in the event of breakdown or commutation, into the channel zone, often also referred to as body zone, then a voltage drop may arise in the channel zone and drive the parasitic bipolar transistor.

The driven parasitic bipolar transistor emits n-type charge carriers (electrons). These electrons inevitably pass into regions with a high field strength, where they bring about, via impact ionization, charge carrier multiplication and thus a second breakdown (second breakthrough). P-type charge carriers (holes) produced as a result of this are conducted into the channel zone. That is to say, into the base of the parasitic bipolar transistor, and thereby amplify the bipolar effect. This process starts to escalate in an uncontrolled manner, and the component is ultimately destroyed.

Edge cells, that is to say, transistor cells at the edge of the transistor cell array, are especially affected by this phenomenon since, for the edge cells, the entire edge substructure acts as an entry region for charge carriers. All holes formed in the edge region traverse the edge cells, resulting in a high voltage drop in the p-doped channel zone. Voltage breakdowns of the field-effect transistor thus occur in an amplified fashion in the region of the edges of the cell array. In order to prevent this, or in order to bring the dielectric strength in the edge region at least to the value of the dielectric strength of transistor cells in the center of the cell array, it is known for the edge cells to be formed differently than the rest of the transistor cells. The essential difference between the edge cells and the transistor cells is that the edge cells have no source zone, so that, rather than a parasitic bipolar transistor, merely a diode is formed by the edge cells, in which case, in the case of an n-conducting MOSFET, a p-doped region of the edge cell, which corresponds to the channel zone in the case of the transistor cells, forms the anode of the diode.

In customary methods for fabricating such vertical power MOSFETS, first a semiconductor body of a specific conduction type (n-conducting in the case of an n-conducting MOSFET) is provided, and channel zones of a complementary conduction type are subsequently introduced into the semiconductor body in a manner proceeding from the front side. In order to form the later gate electrode, first an insulation layer, usually a semiconductor oxide, is deposited onto the semiconductor body, and an electrode layer is subsequently applied to the insulation layer. Cutouts are subsequently produced above the channel zones in the insulation layer and the electrode layer, and the channel zones are subjected to doping reversal in the regions uncovered by virtue of the cutouts in order to form the source zones. A further insulation layer is subsequently deposited onto this configuration, and cutouts are produced in the insulation layer above the channel zones or the source zones in order to make contact with the source zones. In this case, the further insulation layer serves for insulation between the gate electrodes and a source electrode that makes contact with the source zones. In this case, the source electrode is also intended to make contact with the channel zone or anode zone of the edge cells, so that contact holes likewise have to be produced there in the further insulation layer. In order to prevent source zones from being fabricated in the region of the edge cells, the known fabrication method requires an additional method step which follows the fabrication of the cutout in the insulation layer applied to the semiconductor body and the electrode layer. During this method step, a protective layer, for example, a photoresist, is deposited in the region of the edge cells, which covers the surface regions of the semiconductor body that are uncovered in the contact holes, in order thus to prevent a doping reversal.

SUMMARY OF THE INVENTION

It is accordingly an object of the invention to provide a method for fabricating a semiconductor component having at least one transistor cell and an edge cell configured adjacent to the transistor cell, which overcomes the abovementioned disadvantages of the prior art methods of this general type.

In particular, it is an object of the invention to provide a method for fabricating a semiconductor component having at least one transistor cell and an edge cell arranged adjacent to the transistor cell in which an additional method step for preventing a doping in the region of the edge cell can be dispensed with.

With the foregoing and other objects in view there is provided, in accordance with the invention, a method for fabricating a semiconductor component. The method includes steps of:

providing a semiconductor body having a front side, a rear side, at least one transistor cell with at least one channel zone extending into the semiconductor body from the front side, at least one edge cell having at least one first terminal zone configured at a distance from the channel zone, an insulation layer applied to the front side of the semiconductor body, an electrode layer applied to the insulation layer, a cutout formed above the channel zone in the insulation layer and in the electrode layer, and a cutout formed above first terminal zone in the insulation layer and in the electrode layer, the channel zone and the first terminal zone being doped by the same conduction type, which is complementary with respect to surrounding regions of the semiconductor body, the edge cell being adjacent the transistor cell, and the first terminal zone extending into the semiconductor body from the front side;

doping a region of the channel zone that is uncovered by the cutout formed above the channel zone with a dopant of a complementary conduction type with respect to the channel zone to form a first complementary doped region, and doping a region of the first terminal zone that is uncovered by the cutout formed above the first terminal zone with a dopant of a complementary conduction type with respect to the first terminal zone to form a second complementary doped region;

depositing a further insulation layer and patterning the insulation layer to produce a first cutout above the channel zone and to produce a second cutout above the first terminal zone, the electrode layer in the channel zone remaining covered by the insulation layer, the second cutout exposing the cutout formed above the first terminal zone in the electrode layer and in the insulation layer; and fabricating a first contact hole at a bottom of the first cutout of the further insulation layer, the first contact hole reaching through the first complementary doped region into the channel zone, and fabricating a second contact hole above the first terminal zone to at least approximately remove the second complementary doped region.

The semiconductor body preferably includes a heavily doped semiconductor substrate to which a more weakly doped epitaxial layer is applied, in which the channel zone and the first terminal zone are formed. The channel zone and the first terminal zone do not necessarily differ structurally at this juncture of the method, the different designations are chosen in order to provide a better understanding with regard to their later function.

In accordance with an added feature of the invention, a doping is performed using the electrode layer as a mask to introduce the channel zone and the first terminal zone into the semiconductor body.

In accordance with an additional feature of the invention, before applying the insulation layer and the electrode layer to the front side of the semiconductor body, a doping is performed to introduce the channel zone and the first terminal zone into the semiconductor body.

In accordance with another feature of the invention, the method includes subdividing the electrode layer into at least one first section in a region of the transistor cell and a second section in a region of the edge cell.

In accordance with a further feature of the invention, the method includes performing the step of subdividing the electrode layer by fabricating a cutout reaching at least as far as the insulation layer.

In accordance with a further added feature of the invention, the method includes performing an ion implantation to fabricate the first complementary doped region and the second complementary doped region.

In accordance with a further additional feature of the invention, the method includes doping the semiconductor body complementary with respect to the channel zone and the first terminal zone.

In accordance with another added feature of the invention, the method includes providing the insulation layer as a semiconductor oxide.

In accordance with another additional feature of the invention, the first electrode layer includes a metal or a heavily doped semiconductor material.

In accordance with yet an added feature of the invention, first electrode layer includes polysilicon.

In accordance with yet an additional feature of the invention, the method includes providing the semiconductor body with a heavily doped semiconductor substrate and applying an epitaxial layer to the semiconductor substrate.

In accordance with yet another feature of the invention, the method includes doping the semiconductor substrate more heavily than the epitaxial layer.

The inventive method for fabricating a semiconductor component having at least one transistor cell and an edge cell arranged adjacent to the transistor cell provides the method steps explained below.

The channel zone and the first terminal zone can be fabricated in the semiconductor body using conventional methods with mask techniques. These zones are preferably produced by diffusion methods and/or ion implantation methods. In this case, the channel zone and the first terminal zone may be produced in the semiconductor body even before the insulation layer produced, for example, by performing an oxidation, and the electrode layer are applied to the front side of the semiconductor body. The cutouts are then produced above the channel zone and first terminal zone that are already present in the semiconductor body.

The channel zone and the first terminal zone may also be produced after the application of the first insulation layer and the electrode layer and the fabrication of the cutouts above the channel zone and the first terminal zone. The electrode layer then serves as a mask. In this case, the doping is preferably effected by performing an implantation method and a subsequent diffusion method. The diffusion method causes the dopants to propagate under the edges of the mask.

Afterward, regions of the channel zone and of the first terminal zone which are uncovered in the cutouts of the electrode layer and the insulation layer are doped with dopants of a complementary conduction type with respect to the channel zone and the first terminal zone. The region doped complementary with respect to the channel zone forms the later source zone of the transistor cell. In this case, the epitaxial layer forms the drift zone of all the transistor cells and the semiconductor substrate forms the drain zone of all the transistor cells.

In a next method step, a further insulation layer is deposited onto the configuration with the patterned electrode layer and the pattered insulation layer applied to the semiconductor body. The further insulation layer is patterned in such a way that a first cutout is produced above the channel zone of the transistor cells. The electrode layer in this region remains covered by the further electrode layer. The patterning of the further insulation layer also includes the fabrication of a second cutout above the first terminal zone of the edge cell. The second cutout is produced in such a way that the cutout in the electrode layer and the insulation layer applied to the semiconductor body is uncovered.

Afterward, for example by using an etching method, a contact hole is produced in the semiconductor body above the channel zone of the transistor cell and above the first terminal zone of the edge cell. The method for fabricating these contact holes is chosen such that the contact holes reach through the complementary doped zones in the channel zone and the first terminal zone right into the channel zone and the first terminal zone. In the region of the edge cell, the cutout of the electrode layer acts as a mask for this etching process, which has the effect that the complementary doped region is removed as far as the edges of the cutout. In the region of the transistor cell, the regions of the complementary doped zone which are still covered by the further insulation layer remain during the fabrication of the contact hole.

With the inventive method, it is possible to dispense with additional method steps that prevent a doping of the first terminal zone of the edge cell during the method step for fabricating the source zones in the channel zones of the transistor cells. With the inventive method, the first terminal zone of the edge cell is doped together with the channel zones of the transistor cells. The resultant zone doped complementary with respect to the first terminal zone subsequently is removed during the fabrication of the contact holes. What is crucial here is that, in the region of the edge cell, the electrode layer that already serves as a mask during the doping step also serves as a mask during the etching process. In the region of the transistor cells, the further insulation layer protects regions of the complementary doped zones that serve as source zones, so that the regions are also still present in part after the fabrication of the contact holes. The fabrication of contact holes which reach through the source zones right into the channel zones of the transistor cells is necessary in order to short circuit the source zone and the channel zone by using a source electrode fabricated in the contact holes, in order largely to reduce parasitic bipolar effects and to obtain a freewheeling diode.

As explained, the patterned electrode layer forms the gate electrode of the component. Since this gate electrode is uncovered in the region of the edge cells, with the result that, after the deposition of a source electrode, there would be a short circuit present between the source electrode and the gate electrode, in one embodiment of the inventive method, the electrode layer is subdivided, during the patterning for fabricating the gate electrodes, into at least one first section in the region of the transistor cell and a second section in the region of the edge cell. This can be done, for example, by fabricating a cutout which reaches at least as far as the insulation layer. The cutout is filled by the further insulation layer—fabricated later—and thus insulates regions of the electrode layer that form the gate electrodes from the region of the electrode layer in the region of the edge cell, which essentially serves as a mask there during the doping step and the etching step that is effected later.

Other features which are considered as characteristic for the invention are set forth in the appended claims.

Although the invention is illustrated and described herein as embodied in a method for fabricating a semiconductor component having at least one transistor cell and an edge cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross sectional view of a semiconductor body having a front side, a rear side, an insulation layer applied to the front side of the semiconductor body, and an electrode layer applied to the insulation layer;

FIG. 2 is a cross sectional view of the configuration shown in FIG. 1 after method steps in which a patterned mask above the electrode layer and cutouts in the electrode layer have been produced;

FIG. 3 is a cross sectional view of the configuration shown in FIG. 2 after producing a channel zone and a first terminal zone in the region of the front side of the semiconductor body using the electrode layer as a mask;

FIG. 7 is a cross sectional view of the configuration shown in FIG. 6 after fabricating contact holes;

FIG. 8 is a cross sectional view of the configuration shown in FIG. 7 after fabricating a source electrode in the contact holes;

FIG. 9 is a cross sectional view of a semiconductor body having a front side, a rear side, an insulation layer applied to the front side of the semiconductor body, an electrode layer applied to the insulation layer, and a channel zone and a first terminal zone in the semiconductor body; and FIG. 10 is a cross sectional view of the configuration shown in FIG. 9 after producing cutouts in the electrode layer and the insulation layer above the channel zone and the first terminal zone.

DESCRIPTION OF THE PREFERRED EMBODIMENTS

Figure 4:
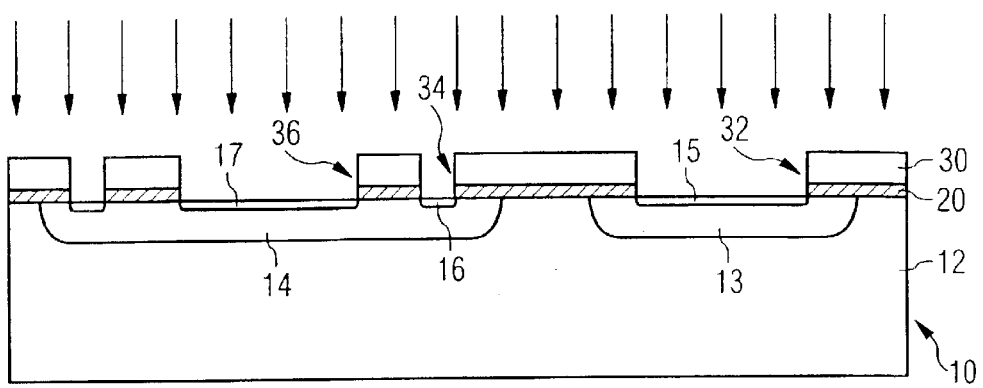
FIG. 4 is a cross sectional view of the configuration shown in FIG. 3 during a doping step.

In the figures unless specified otherwise, identical reference symbols designate identical parts and zones with the same meaning.

Referring now to the figures of the drawing in detail and first, particularly, to FIG. 1 thereof, there is shown a cross section through a configuration having a semiconductor body 10 with a front side 101 and a rear side 102, an insulation layer 20 applied to the front side 101 of the semiconductor body 10, and an electrode layer 30 applied to the insulation layer 20. The semiconductor body 10 is of a first conduction type, for example, n-conducting in the case of an n-channel MOSFET. FIG. 2 shows the configuration in accordance with FIG. 1 after method steps in which a mask 200, for example, made of photoresist, has been deposited onto the electrode layer 30 and cutouts 32, 36 have been produced in the electrode layer 30 and the insulation layer 10 using the mask 200. The mask 200 has cutouts 232 and 236 and serves for patterning the electrode layer 30 and the insulation layer 20, namely for producing the cutouts 32, 36. This patterning is effected by using an etching method, for example. This etching method may be effected in two stages, for example, in which case, in a first method step, the electrode layer 30 is removed and the insulation layer 20 serves as an etching stop layer, and in which case, in a next method step, the insulation layer 20 is removed and the semiconductor body 10 serves as an etching stop layer.

FIG. 3 shows the configuration in accordance with FIG. 2 after the removal of the mask 200 and further method steps in which, using the electrode layer 30 as a mask, a channel zone 13 of a later transistor cell and a first terminal zone 14 of a later edge cell have been produced, which extend into the semiconductor body in a manner proceeding from the front side 101 and are arranged at a distance from one another in the lateral direction of the semiconductor body 10.

In order to fabricate the channel zone 13 and the first terminal zone 14, which are doped complementary with respect to the semiconductor body, first, dopants are introduced through the cutouts 32, 36 into the semiconductor body 10 by using an ion implantation method, for example, which is followed by a diffusion method in order to achieve a propagation of the implanted dopants in particular under the edges of the cutouts 32, 36 and thus to arrive at the zones 13, 14 illustrated in FIG. 3.

The semiconductor body 12 preferably includes a heavily doped semiconductor substrate 12A and a more weakly doped epitaxial layer 12B applied to the semiconductor substrate 12A (See FIG. 1). In order to form an n-conducting vertical MOSFET, the semiconductor body 10 is n-doped and the channel zone 13 and the first terminal zone 14 are p-doped. The channel zone 13 forms the channel zone or body zone of a transistor cell of the later vertical MOSFET. The first terminal zone 14 forms a terminal zone of an edge cell of the MOSFET. The channel zone 13 and the first terminal zone 14 do not necessarily differ structurally at this juncture of the method. However, the different designations have been chosen with regard to the later function.

FIG. 4 shows the configuration during a further method step in which dopants are doped, for example using an ion implantation method into uncovered regions of the channel zone 13 and the first terminal zone 14. A complementary doped zone 15, which forms the later source zone of the transistor cell, is produced as a result of this in the channel zone 13. In the region of the first terminal zone 14, complementary doped zones 17, 16 are likewise produced at the bottom of the cutout 36 and also at the bottom of the cutout 34.

Figure 5:
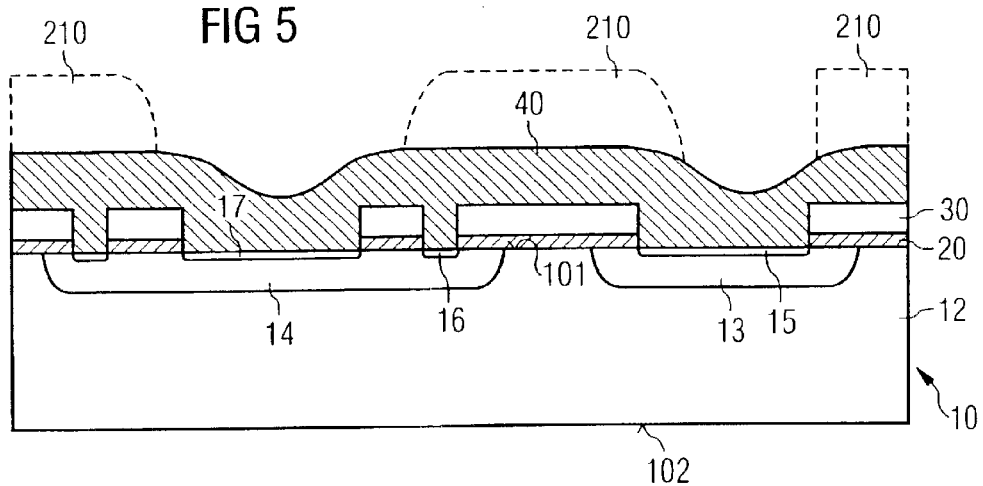
FIG. 5 is a cross sectional view of the configuration shown in FIG. 4 after applying a further insulation layer.

FIG. 5 shows the configuration in accordance with FIG. 4 after a next method step in which a further insulation layer 40 has been deposited onto the configuration. The further insulation layer 40 covers both the electrode layer 30 and the uncovered regions of the front side 101 of the semiconductor body.

Figure 6:
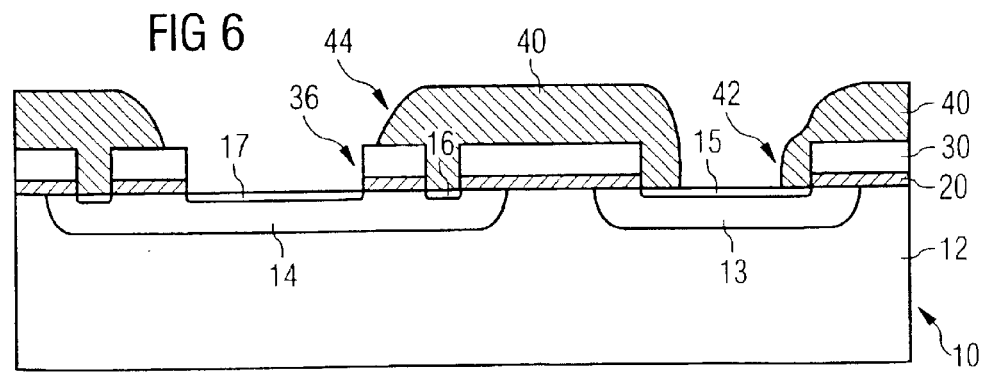
FIG. 6 is a cross sectional view of the configuration shown in FIG. 5 after patterning the further insulation layer.

FIG. 6 shows the configuration in accordance with FIG. 5 after further method steps in which the further insulation layer 40 has been patterned to produce a first cutout 42 above the channel zone 13 and the source zone 15 and to produce a second cutout 44 above the first terminal zone 14. The fabrication of the cutouts 42, 44 in the further insulation layer 40 is preferably effected using conventional methods with mask techniques. A suitable mask 210 is illustrated by broken lines in FIG. 5. The fabrication of the cutout 42 above the channel zone 13 is effected in such a way that the further insulation layer 40 completely covers the electrode layer 30 above the channel zone 13 and thus also partly covers regions of the source zone 15 at the bottom of the cutout formed through the electrode layer 30 and the insulation layer 20. The mask 210 is chosen to fabricate the cutout 44 of the further insulation layer 40 so as to completely uncover the cutout 36 of the electrode layer 30 and the insulation layer 20 or to completely uncover the complementary doped layer 17 at the bottom of the cutout 36.

FIG. 7 shows the configuration in accordance with FIG. 6 after further method steps in which a contact hole 18 has been introduced into the front side 101 of the semiconductor body 10 in the region of the source zone 15 and the channel zone 13. The further insulation layer 40 in this region serves as a mask during the fabrication of the contact hole 18. This contact hole is fabricated, for example, by using an etching method. At the same time, a contact hole 19 is produced in the semiconductor body 10 in the region of the first terminal zone 14. The cutout 36 of the electrode layer 30 and of the insulation layer 20 serves as a mask in this region. In the context of the fabrication of this contact hole 19, the complementary doped zone 17 is completely or is at least approximately completely removed. The regions of the source zone 15 which are covered by the further insulation layer 40 remain in the region of the transistor cell.

FIG. 8 shows the configuration in accordance with FIG. 7 after further method steps have been carried out, in which an electrode layer 50 has been deposited onto the further insulation layer 40 and the uncovered regions of the semiconductor body.

FIG. 8 simultaneously illustrates the cross section through a semiconductor component fabricated using the inventive method. The description of methods required for fabricating passivation layers and metallization layers in the region of the rear side of the semiconductor body have been dispensed with for reasons of clarity. The semiconductor component fabricated using the inventive method includes a transistor cell TZ that is illustrated in the right-hand region of the excerpt, and an edge cell RZ that is illustrated in the left-hand region of the excerpt and is arranged adjacent to the transistor cell TZ. The transistor cell TZ includes a source zone 15, a channel zone or body zone doped complementary with respect to the source zone 15, and a drain zone 12 doped complementary with respect to the channel zone 13 or correspondingly with respect to the source zone 15. In the exemplary embodiment, the drain zone is subdivided into a more weakly doped epitaxial layer 12b surrounding the channel zone 13 and a more heavily doped substrate zone 12a forming the actual drain terminal. In the case of an n-conducting MOSFET, the drain zone 12 is n-doped, the channel zone 13 is p-doped and the source zone 15 is n-doped. Contact is made with the source zone 15 and the body zone 13 by the electrode 50, which forms the source electrode S of the component. In the region of the transistor cell TZ, the source electrode 50 is insulated from the electrode layer 30 by the further insulation layer 40. The electrode layer 30 in this region extends in the lateral direction from the source zone 15 over the channel zone 13 as far as the drift zone 12b and is insulated from the semiconductor body 10 by the insulation layer 20. In this region, the electrode layer 30 forms the gate electrode of the transistor cell TZ.

As is not more specifically illustrated, the semiconductor component has a multiplicity of such transistor cells TZ that preferably adjoin one another symmetrically. The source electrode 50 short-circuits the source zone 15 and the channel zone 13 in order to eliminate the effect of a parasitic bipolar transistor formed by the source zone 15, the channel zone 13 and the drift zone 12b. As a result, a freewheeling diode is formed between the source electrode 50 and the source zone 12. The electrical equivalent circuit diagram of the transistor and of the freewheeling diode in the region of the transistor cell TZ is depicted in FIG. 8.

In the region of the edge cell RZ, rather than a transistor structure, merely a diode is formed between the source electrode 50 and the drain zone 12. In the case of an n-conducting MOSFET, the anode of the diode is formed by the first terminal zone 14 and the cathode is formed by the drain zone 12. Since the insulation layer 40 exposes the electrode layer 30 in the region of the edge cell RZ, the source electrode 50 makes contact with the electrode layer 30 in this region. In this case, the cutout 34 isolates the electrode region with which contact is made by the source electrode 50 from the electrode region forming the gate electrode. The cutout is filled by the further insulation layer 40 in order to insulate the electrodes from one another. The doped zone 16 present at the bottom of the cutout 34 has no influence on the functioning of the semiconductor component.

The essential aspect of the present invention consists in dispensing with a masking of the edge cell RZ during the fabrication of the source zone 15 in the region of the transistor cell TZ, so that a "source zone" (17 in FIG. 5) is initially fabricated there, too. The "source zone" is completely removed during the subsequent method steps, in which a contact hole is fabricated in the region of the transistor cell TZ, by virtue of the fact that, in the region of the edge cell RZ, the electrode layer 30 which serves as a mask during the doping also serves as a mask during the fabrication of the contact hole.

Even for the case where charge carriers doped complementary with respect to the first terminal zone 14 still remain during the fabrication of the contact hole, the number of these remaining dopant atoms is so low that a parasitic bipolar transistor which might turn on is not formed in the region of the edge cell RZ.

In the case of the method explained with reference to FIGS. 1 to 8, the channel zone 13 and the first terminal zone 14 are produced in the semiconductor body 10 using the electrode layer and the cutouts 32, 36 thereof as a mask. In this case, the same mask also serves for fabricating the later source zone 15. This ensures a self-aligned fabrication of the channel zone 13 and the source zone 15.

However, the channel zone 13 and the first terminal zone 15 may also already be produced in the semiconductor body before the insulation layer 20 and the electrode layer 30 are applied, as is illustrated with reference to FIGS. 9 and 10.

FIG. 9 shows a cross section through a configuration having a semiconductor body 10 with a front side 101 and a rear side 102, an insulation layer 20 applied to the front side 101 of the semiconductor body 10, an electrode layer 30 applied to the insulation layer 20, and also a channel zone 13 and a first terminal zone 14, which are doped complimentarily with respect to the semiconductor body 10 and are formed in the region of a front side 101 of the semiconductor body 10.

FIG. 10 shows the configuration according to FIG. 9 after a patterning of the electrode layer 30 and the insulation layer 20 in such a way that cutouts 32, 34, 36 are produced in the electrode layer 30 and the insulation layer 20 above the channel zone 13 and the first terminal zone 14. To that end, a mask 210 with cutouts 232, 234, 236 is applied to the semiconductor body 10 and the openings 32, 34, 36 are introduced into the electrode layer and the insulation layer by using an etching method, for example. The further method steps correspond, after removing the mask 210, to the method steps explained with reference to FIGS. 4 to 8.

I claim:

1. A method for fabricating a semiconductor component, the method which comprises:
providing a semiconductor body having a front side, a rear side, at least one transistor cell with at least one channel zone extending into the semiconductor body from the front side, at least one edge cell having at least one first terminal zone configured at a distance from the channel zone, an insulation layer applied to the front side of the semiconductor body, an electrode layer applied to the insulation layer, a cutout formed above the channel zone in the insulation layer and in the electrode layer, and a cutout formed above first terminal zone in the insulation layer and in the electrode layer, the channel zone and the first terminal zone being doped by the same conduction type, which is complementary with respect to surrounding regions of the semiconductor body, the edge cell being adjacent the transistor cell, and the first terminal zone extending into the semiconductor body from the front side;

doping a region of the channel zone that is uncovered by the cutout formed above the channel zone with a dopant of a complementary conduction type with respect to the channel zone to form a first complementary doped region, and doping a region of the first terminal zone that is uncovered by the cutout formed above the first terminal zone with a dopant of a complementary conduction type with respect to the first terminal zone to form a second complementary doped region;

depositing a further insulation layer and patterning the insulation layer to produce a first cutout above the channel zone and to produce a second cutout above the first terminal zone, the electrode layer in the channel zone remaining covered by the insulation layer, the second cutout exposing the cutout formed above the first terminal zone in the electrode layer and in the insulation layer; and fabricating a first contact hole at a bottom of the first cutout of the further insulation layer, the first contact hole reaching through the first complementary doped region into the channel zone, and fabricating a second contact hole above the first terminal zone to at least approximately remove the second complementary doped region.

2. The method according to claim 1, which further comprises performing a doping using the electrode layer as a mask to introduce the channel zone and the first terminal zone into the semiconductor body.

3. The method according to claim 1, which further comprises, before applying the insulation layer and the electrode layer to the front side of the semiconductor body, performing a doping to introduce the channel zone and the first terminal zone into the semiconductor body.

4. The method according to claim 1, which further comprises subdividing the electrode layer into at least one first section in a region of the transistor cell and a second section in a region of the edge cell.

5. The method according to claim 4, which further comprises performing the step of subdividing the electrode layer by fabricating a cutout reaching at least as far as the insulation layer.

6. The method according to claim 1, which further comprises performing an ion implantation to fabricate the first complementary doped region and the second complementary doped region.

7. The method according to claim 1, which further comprises doping the semiconductor body complementary with respect to the channel zone and the first terminal zone.

8. The method according to claim 1, which further comprises providing the insulation layer as a semiconductor oxide.

9. The method according to claim 1, wherein the first electrode layer includes a metal or a heavily doped semiconductor material.

10. The method according to claim 1, wherein the first electrode layer includes polysilicon.

11. The method according to claim 1, which further comprises providing the semiconductor body with a heavily doped semiconductor substrate and applying an epitaxial layer to the semiconductor substrate.

12. The method as claimed in claim 1, which further comprises doping the semiconductor substrate more heavily than the epitaxial layer.

* * * * *